(12) United States Patent
Zhou et al.

(10) Patent No.: US 12,261,575 B1
(45) Date of Patent: Mar. 25, 2025

(54) SIGNAL AMPLIFYING CIRCUIT AND DISPLAY DEVICE

(71) Applicant: TCL CHINA STAR OPTOELECTRONICS TECHNOLOGY CO., LTD., Guangdong (CN)

(72) Inventors: Zhichao Zhou, Guangdong (CN); Zhiwei Tan, Guangdong (CN)

(73) Assignee: TCL CHINA STAR OPTOELECTRONICS TECHNOLOGY CO., LTD., Shenzhen (CN)

(*) Notice: Subject to any disclaimer, the term of this patent is extended or adjusted under 35 U.S.C. 154(b) by 0 days.

(21) Appl. No.: 18/401,542

(22) Filed: Dec. 31, 2023

(30) Foreign Application Priority Data

Nov. 23, 2023 (CN) .......................... 202311577380.0

(51) Int. Cl.
*G09G 3/20* (2006.01)
*H03F 3/04* (2006.01)

(52) U.S. Cl.
CPC ................. *H03F 3/04* (2013.01); *G09G 3/20* (2013.01); *G09G 2300/0852* (2013.01)

(58) Field of Classification Search
CPC ..... H03F 3/04; G09G 3/20; G09G 2300/0852
See application file for complete search history.

(56) References Cited

U.S. PATENT DOCUMENTS

2018/0234096 A1* 8/2018 Li ......................... H03K 17/941
2024/0163583 A1* 5/2024 Ben-Dor ................ H04N 25/77

* cited by examiner

*Primary Examiner* — Kevin M Nguyen
(74) *Attorney, Agent, or Firm* — PV IP PC; Wei Te Chung

(57) ABSTRACT

The present application provides a signal amplifying circuit and a display device. In the signal amplifying circuit, a gate of a driving transistor of a first inverter is connected to an output terminal of a reset module, and thereby a potential of the gate of the driving transistor of the first inverter changes when an impedance of an optoelectronic device changes, so that a potential change of each node of the first inverter amplifies the signal. Besides, a first compensation transistor is connected between a second gate of the first driving transistor and a first output node, and the potential of the first output node precharges to the second gate of the first driving transistor to adjust a threshold voltage of the first driving transistor, thereby erasing the difference of the threshold voltages in different transistors, and solving the technical problem of bad uniformity of signals amplified by the inverter.

20 Claims, 3 Drawing Sheets

SIGNAL AMPLIFYING CIRCUIT AND DISPLAY DEVICE

CROSS-REFERENCE TO RELATED APPLICATIONS

This application claims priority to Chinese Patent Application No. 202311577380.0 filed on Nov. 23, 2023. The disclosure of the aforementioned application is incorporated herein by reference in its entirety.

TECHNICAL FIELD

The present application relates to the field of display technologies, and more particularly, to a signal amplifying circuit and a display device.

BACKGROUND

Touchless touchscreens are of great interest due to their advantages on the unique 3D touch, and photodetectors are a good choice for touchless touchscreens as sensing units for gesture motion tracking. The working principle of photoelectric sensors is that resistance values of photodiodes change with changing optical signals, so as to realize change of photoelectric signals, through which a gesture position is determined. However, a human hand cannot emit light by itself. Therefore, certain ambient light is required to assist. However, weaker ambient light results in weak light signals and therefore weak photoelectric signals, which are difficult to capture and easily affected by noise.

The conventional touchless touchscreens amplify the signals generated under weak light. However, due to a difference of threshold voltages in different transistors, a technical problem of bad uniformity in signals amplified by the inverter occurs, resulting in a problem of low response accuracy under weak light.

SUMMARY

An embodiment of the present application provides a signal amplifying circuit and a display device for solving the technical problem of existing touchless touchscreens that signals amplified by an inverter have bad uniformity.

An embodiment of the present application provides a signal amplifying circuit comprising:
a reset module, wherein an input terminal of the reset module is connected to an input signal terminal;
an optoelectronic device, wherein a first terminal of the optoelectronic device is connected to an output terminal of the reset module, and a second terminal of the optoelectronic device is connected to the input signal terminal and the input terminal of the reset module;
a positive feedback module, wherein a first terminal of the positive feedback module is connected to a first constant voltage signal terminal, a second terminal of the positive feedback module is connected to a second constant voltage signal terminal, the positive feedback module at least includes a first inverter, the first inverter includes a first load transistor, a first driving transistor and a first output node, the first load transistor and the first driving transistor are connected to the first output node in the first inverter, the first output node is electrically connected to the output signal terminal, and a potential of the second constant voltage signal terminal is larger than a potential of the first constant voltage signal terminal;
wherein the first inverter further comprises a first compensation transistor, the first driving transistor comprises a first gate and a second gate, the first gate of the first driving transistor being connected to the output terminal of the reset module, a first electrode of the first compensation transistor being connected to the first output node, and a second electrode of the first compensation transistor being connected to the second gate of the first driving transistor.

In the signal amplifying circuit of the present application, the first inverter further includes a first storage capacitor, a first plate of the first storage capacitor being connected to the second gate of the first driving transistor, and a second plate of the first storage capacitor being connected to the first constant voltage signal terminal.

In the signal amplifying circuit of the present application, the first load transistor includes a first gate and a second gate, the first gate of the first load transistor being connected to a first electrode of the first load transistor, and the second gate of the first load transistor being connected to the first output node.

In the signal amplifying circuit of the present application, the positive feedback module further includes a second inverter including a second load transistor, a second driving transistor, a second compensation transistor, and a second output node, a gate of the second load transistor is connected to the second constant voltage signal terminal, a first electrode of the second load transistor is connected to the second constant voltage signal terminal, a second electrode of the second load transistor and a first electrode of the second driving transistor are connected to the second output node, a gate of the first load transistor is connected to the second output node, and a second electrode of the second driving transistor is connected to the first constant voltage signal terminal;
wherein the second driving transistor includes a first gate and a second gate, the first gate of the second driving transistor being connected to the first output node, a first electrode of the second compensation transistor being connected to the second output node, and a second electrode of the second compensation transistor being connected to the second gate of the second driving transistor.

In the signal amplifying circuit of the present application, the reset module includes a reset transistor, a first electrode of the reset transistor being connected to the input signal terminal, a second electrode of the reset transistor being connected to the first terminal of the optoelectronic device, and a gate of the reset transistor being connected to a first scan signal line.

In the signal amplifying circuit of the present application, the signal amplifying circuit further including a voltage follower including a third load transistor, a third driving transistor, and a third output node, a gate of the third driving transistor being connected to the first output node, a first electrode of the third driving transistor being connected to the second constant voltage signal terminal, a second electrode of the third driving transistor and a first electrode of the third load transistor being connected to the third output node, a gate of the third load transistor being connected to a second scan signal line, and a second electrode of the third load transistor being connected to the first constant voltage signal terminal.

In the signal amplifying circuit of the present application, the third driving transistor includes a first gate and a second gate, the first gate of the third driving transistor is connected to the first output node, and the second gate of the third driving transistor is connected to the third output node; and the third load transistor includes a first gate connected to the second scan signal line and a second gate connected to the first constant voltage signal terminal.

In the signal amplifying circuit of the present application, the signal amplifying circuit further including an addressing module including an addressing transistor, a first electrode of the addressing transistor being connected to the third output node, a gate of the addressing transistor being connected to a third scan signal line, and a second electrode of the addressing transistor being connected to the output signal terminal.

In the signal amplifying circuit of the present application, the reset transistor includes a first gate and a second gate, the first gate of the reset transistor is connected to the first scan signal line, and the second gate of the reset transistor is connected to a fourth scan signal line;

the first compensation transistor includes a first gate and a second gate, the first gate of the first compensation transistor is connected to the first scan signal line, and the second gate of the first compensation transistor is connected to the fourth scan signal line; and the addressing transistor includes a first gate connected to the third scan signal line and a second gate connected to the fourth scan signal line.

The present application also provides a display device including a plurality of pixel units, at least one of which includes a pixel circuit and a signal amplifying circuit according to any one of the above embodiments.

Beneficial effects: a signal amplifying circuit and a display device are provided; the signal amplifying circuit includes a reset module, an optoelectronic device and a positive feedback module, where an input terminal of the reset module is connected to an input signal terminal, a first terminal of the optoelectronic device is connected to an output terminal of the reset module, and a second terminal is connected to the input signal terminal and the input terminal of the reset module, a first terminal of the positive feedback module is connected to a first constant voltage signal terminal, a second terminal of the positive feedback module is connected to a second constant voltage signal terminal, the positive feedback module at least includes a first inverter, the first inverter includes a first load transistor, a first driving transistor and a first output node, the first load transistor and the first driving transistor are connected to the first output node in the first inverter, the first output node is electrically connected to the output signal terminal, and a potential of the second constant voltage signal terminal is larger than a potential of the first constant voltage signal terminal. And the first driving transistor includes a first gate and a second gate. The first gate of the first driving transistor is connected to the output terminal of the reset module, the first electrode of the first compensation transistor is connected to the first output node, and the second electrode of the first compensation transistor is connected to the second gate of the first driving transistor. By connecting the gate of the driving transistor of the first inverter to the output terminal of the reset module in the signal amplifying circuit, the potential of the gate of the driving transistor of the first inverter changes when the impedance of the optoelectronic device changes, so that the potential change of each node of the first inverter amplifies the signal; besides, the first compensation transistor is connected between the second gate of the first driving transistor and the first output node, and the potential of the first output node precharges the second gate of the first driving transistor to adjust the threshold voltage of the first driving transistor, thereby erasing the difference of the threshold voltages in different transistors, and solving the technical problem of bad uniformity of signals amplified by the inverter.

BRIEF DESCRIPTION OF THE DRAWINGS

The technical solution and other beneficial effects of the present application will be apparent from the following detailed description of specific embodiments thereof, taken in conjunction with the accompanying drawings.

DETAILED DESCRIPTION

The technical solution in the embodiments of the present invention will be clearly and completely described with reference to the accompanying drawings. It will be apparent that the described embodiments are only part of the embodiments of the present application, and not all embodiments. Based on the embodiments in the present application, all other embodiments obtained by a person skilled in the art without involving any inventive effort are within the scope of the present application.

Embodiments of the present application provide a signal amplifying circuit and a display device for alleviating the above-mentioned technical problem that the poor amplification effect of a multi-stage inverter in a conventional touchless touchscreen causes low response accuracy under weak light.

Figure 1:
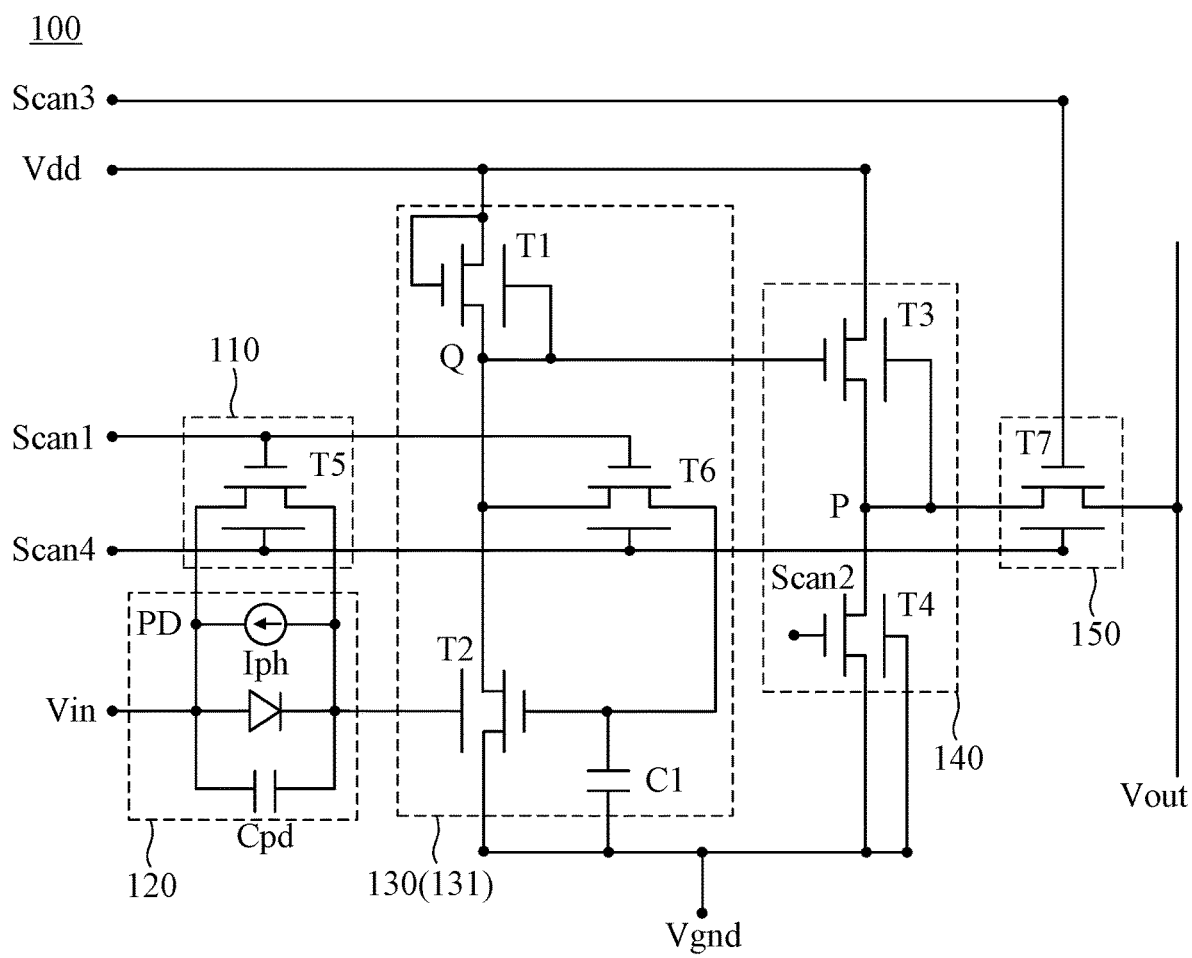
FIG. 1 is a circuit diagram of a signal amplifying circuit according to an embodiment of the present application.
Figure 2:
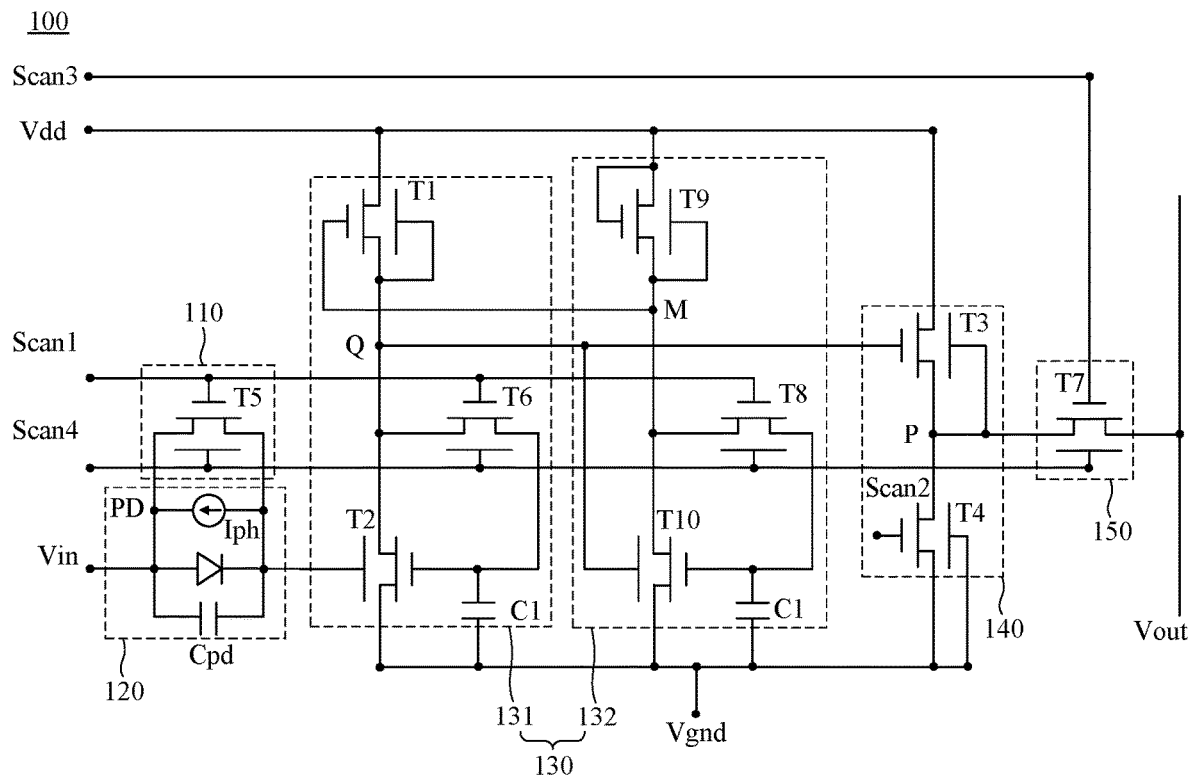
FIG. 2 is another circuit diagram of a signal amplifying circuit according to an embodiment of the present application.

Referring to FIGS. 1 and 2, an embodiment of the present application provides a signal amplifying circuit 100 including a reset module 110, an optoelectronic device 120, and a positive feedback module 130.

In the present embodiment, the input terminal of the reset module 110 is connected to the input signal terminal Vin. The first terminal of the optoelectronic device 120 is connected to the output terminal of the reset module 110. The second terminal of the optoelectronic device 120 is connected to the input signal terminal Vin and the input terminal of the reset module 110. The first terminal of the positive feedback module 130 is connected to the first constant voltage signal terminal Vgnd, and the second terminal of the positive feedback module 130 is connected to the second constant voltage signal terminal Vdd.

In the present embodiment, the positive feedback module 130 at least includes a first inverter 131 including a first load transistor T1, a first driving transistor T2, and a first output node Q. The first load transistor T1 and the first driving transistor T2 are connected to the first output node Q in the first inverter 131. The first output node Q is electrically connected to the output signal terminal Vout. The potential of the second constant voltage signal terminal Vdd is greater than the potential of the first constant voltage signal terminal Vgnd.

In the present embodiment, the first inverter 131 further includes a first compensation transistor T6. The first driving transistor T2 includes a first gate and a second gate. The first gate of the first driving transistor T2 is connected to the output terminal of the reset module 110. The first electrode of the first compensation transistor T6 is connected to the first output node Q. The second electrode of the first compensation transistor T6 is connected to the second gate of the first driving transistor T2.

According to the signal amplifying circuit 100 of the present application, the gate of the first driving transistor T2 of the first inverter 131 is connected to the output terminal of the reset module 110, the potential of the gate of the first driving transistor T2 of the first inverter 131 changes when an impedance of the optoelectronic device 120 changes, so that the potential of each node of the first inverter 131 changes to amplify the signal. At the same time, the first compensation transistor T6 is connected between the second gate of the first driving transistor T2 and the first output node Q, and the potential of the first output node Q is output to and precharge the second gate of the first driving transistor T2 to adjust a threshold voltage of the first driving transistor T2, thereby erasing the difference of the threshold voltages in different transistors, and solving the technical problem of bad uniformity in signals amplified by the inverter.

In the present embodiment, the optoelectronic device 120 is shown with a diode PD, a current source Iph, and a capacitor Cpd. The optoelectronic device 120 has a fixed capacitor Cpd. When no electrical signal is input, the optoelectronic device 120 can be simplified as the diode PD. When the optoelectronic device 120 is illuminated, the current source Iph generates an opposite current.

In the present embodiment, the photoelectric device 120 may be one of a photodiode, a phototransistor, and a photoresistor.

In this embodiment, the first terminal of the optoelectronic device 120 may be a cathode, and the second terminal of the optoelectronic device 120 may be an anode. Meanwhile, the first terminal of the photoelectric device 120 may be an input terminal of the phototransistor, and the second terminal of the photoelectric device 120 may be an output terminal of the phototransistor.

It should be noted that in the drawings of the embodiments of the present application, solid points indicate connections between the intersecting traces. If there is no solid point shown between two intersecting traces, the two intersecting traces are not connected.

In the present embodiment, the optoelectronic device 120 may include one of a perovskite photodetector, a hydrogenated amorphous silicon photodetector, and a metal oxide photodetector.

In the present embodiment, referring to FIG. 1, the reset module 110 includes a reset transistor T5. A first electrode of the reset transistor T5 is connected to the input signal terminal Vin, a second electrode of the reset transistor T5 is connected to the first terminal of the optoelectronic device 120, and a gate of the reset transistor T5 is connected to the first scan signal line Scan1. The reset module 110 of the present application includes the reset transistor T5 so that the first reset transistor T5 can control whether the signal of the signal amplifying circuit 100 is input, thereby causing the signal amplifying circuit 100 to operate or to stop operating.

The present application is described with the example in which the reset module 110 includes one reset transistor T5, but the embodiments of the present application are not limited thereto, and the reset module 110 may include a plurality of reset transistors T5.

In the present embodiment, the reset transistor T5 may have a single gate or double gates. And when the reset transistor T5 has a single gate, the gate of the reset transistor T5 is connected to the first scan signal line Scan1. When the reset transistor T5 has double gates, as shown in FIG. 1, the first gate of the reset transistor T5 is connected to the first scan signal line Scan1, and the second gate of the reset transistor T5 may be connected to the fourth scan signal line Scan4.

In the present embodiment, by connecting the first gate of the reset transistor T5 to a preceding scan signal line, an increased on-state current and a decreased off-state current can be obtained. And when the preceding scan signal line is turned on, one terminal of the photoelectric device 120 can be charged to a voltage as the input voltage of the input signal terminal Vin. Next, the present application adjusts the threshold voltage of the reset transistor T5 by adjusting the value of the input voltage of the fourth scan signal line Scan4.

In the present embodiment, referring to FIG. 1, in the first inverter 131 of the present application, the gate of the first load transistor T1 is connected to the second constant voltage signal terminal Vdd. The first electrode of the first load transistor T1 is connected to the second constant voltage signal terminal Vdd. And the second electrode of the first load transistor T1 is connected to the first output node Q. The first electrode of the first driving transistor T2 is connected to the first output node Q, the second electrode of the first driving transistor T2 is connected to the first constant voltage signal terminal Vgnd, the first electrode of the first compensation transistor T6 is connected to the first output node Q, and the second electrode of the first compensation transistor T6 is connected to the second gate of the first driving transistor T2.

In the present application, the first compensation transistor T6 is configured in the first inverter 131 to connect the second gate of the first driving transistor T2 and the first output node Q. When the first compensation transistor T6 is turned on, the first compensation transistor T6 allows the potential of the first output node Q to precharge the second gate of the first driving transistor T2 to adjust the threshold voltage of the first driving transistor T2, thereby erasing the difference of the threshold voltages in different transistors, and solving the technical problem of bad uniformity in signals amplified by the inverter.

In the present embodiment, the first compensation transistor T6 may have a single gate or double gates. And when the first compensation transistor T6 has a single gate, the gate of the first compensation transistor T6 is connected to the first scan signal line Scan1. When the first compensation transistor T6 has double gates, as shown in FIG. 1, the first gate of the first compensation transistor T6 is connected to the first scan signal line Scan1, and the second gate of the first compensation transistor T6 may be connected to the fourth scan signal line Scan4. In the present application, by connecting the first gate of the first compensation transistor T6 to the preceding scan signal line, an increased on-state current and a decreased off-state current can be obtained. And when the preceding scan signal line is turned on, the potential of the first output node Q can precharge the second gate of the first driving transistor T2. Next, the present application may adjust the threshold voltage of the first compensation transistor T6 by adjusting the value of the input voltage of the fourth scan signal line Scan4.

In the present embodiment, the gate(s) of the first load transistor T1 may be a single gate or double gates. For example, the first load transistor T1 may include a first gate and a second gate. The first gate of the first load transistor T1 is connected to the first electrode of the first load transistor T1. And the second gate of the first load transistor T1 is connected to the first output node Q. In the present application, by making the first load transistor T1 with double-gate design, the control capability of the first load transistor T1 can be improved, and the stability of the circuit can be improved.

Referring to FIG. 1, the first inverter 131 may further include a first storage capacitor C1, a first plate of which is connected to the second gate of the first driving transistor T2, and a second plate of which is connected to the first constant voltage signal terminal Vgnd.

In the present embodiment, when the first compensation transistor T6 is turned on, the first compensation transistor T6 allows the potential of the first output node Q to precharge the second gate of the first driving transistor T2. And the potential of the first output node Q is maintained by the first storage capacitor C1. The first storage capacitor C1 can maintain the potential of the second gate of the first driving transistor T2 at the same potential as the first output node Q. And the first storage capacitor C1 can continuously adjust the threshold voltage of the first driving transistor T2 to avoid that the potential of the second gate of the first driving transistor T2 cannot be maintained at the same potential as the first output node Q due to leakage of electricity, thereby improving the stability of the potential of the second gate of the first driving transistor T2, further erasing the difference of the threshold voltages in different transistors, and solving the technical problem of the bad uniformity is signals amplified by the inverter.

In the present embodiment, referring to FIG. 1, the signal amplifying circuit 100 further includes a voltage follower 140 including at least a third load transistor T4, a third driving transistor T3, and a third output node P. The gate of the third driving transistor T3 is connected to the first output node Q. The first electrode of the third driving transistor T3 is connected to the second constant voltage signal terminal Vdd. The second electrode of the third driving transistor T3 and the first electrode of the third load transistor T4 are connected to the third output node P. The gate of the third load transistor T4 is connected to the second scan signal line Scan2. The second electrode of the third load transistor T4 is connected to the first constant voltage signal terminal Vgnd. In the present application, the voltage follower 140 is provided so that the voltage follower 140 is used to follow the output amplified signal. And the electrical signal output from the positive feedback module 130 is output through the voltage follower 140, thereby avoiding signal interference, and the output may be buffered by the voltage follower 140.

In the present embodiment, the gate(s) of the third driving transistor T3 may be a single gate. The gate(s) of the third driving transistor T3 may also include a first gate and a second gate. As shown in FIG. 1, the third driving transistor T3 includes a first gate and a second gate. The first gate of the third driving transistor T3 is connected to the first output node Q. The second gate of the third driving transistor T3 is connected to the third output node P.

In this embodiment, the gate(s) of the third load transistor T4 may be a single gate. The gate(s) of the third load transistor T4 may also include a first gate and a second gate. As shown in FIG. 1, the third load transistor T4 includes a first gate and a second gate. The first gate of the third load transistor T4 is connected to the second scan signal line Scan2, and the second gate of the third load transistor T4 is connected to the first constant voltage signal terminal Vgnd.

In the present embodiment, referring to FIG. 1, the signal amplifying circuit 100 further includes an addressing module 150 including at least one addressing transistor T7. A first electrode of the addressing transistor T7 is connected to the third output node P. A gate of the addressing transistor T7 is connected to the third scan signal line Scan3. And a second electrode of the addressing transistor T7 is connected to the output signal terminal Vout. In the present application, the addressing transistor T7 is provided so that the gate of the addressing transistor T7 is connected to the third scan signal line Scan3. And when a current scan signal line is turned on by a progressive scan square wave signal, the voltage at the output signal terminal Vout is read by the addressing transistor T7.

In this embodiment, the gate(s) of the addressing transistor T7 may be a single gate. The gate(s) of the addressing transistor T7 may also include a first gate and a second gate. As shown in FIG. 1, the first gate of the addressing transistor T7 is connected to the third scan signal line Scan3. And the second gate of the addressing transistor T7 is connected to the fourth scan signal line Scan4. The addressing transistor T7 may obtain an increased on-state current and a decreased off-state current. Next, the present application adjusts the threshold voltage of the addressing transistor T7 by adjusting the value of the input voltage of the fourth scan signal line Scan4.

In the present embodiment, the first scan signal line Scan1 may be a preceding-stage scan signal line. The third scan signal line Scan3 may be a current-stage scan signal line. The input voltage of the second scan signal line Scan2 may turn on the third load transistor T4. And the third load transistor T4 is always in a on state. And the fourth scan signal line Scan4 is mainly used to adjust the threshold voltages of the reset transistor T5, the first compensation transistor T6, and the addressing transistor T7.

In the present embodiment, the first electrode and the second electrode in the transistors are respectively one of the source or the drain, which are different from each other. The functions and structures of the first electrode and the second electrode are the same, and only have different names.

In the present embodiment, the first gates of the reset transistor T5, the first driving transistor T2, the first load transistor T1, the first compensation transistor T6, the second load transistor T9, the second driving transistor T10, and the addressing transistor T7 may each be one of the bottom gate or the top gate, and the second gates may each be the other of the bottom gate or the top gate.

In the present embodiment, the aspect ratio of the load transistor is smaller than the aspect ratio of the driving transistor so that the signal can be amplified. For example, the aspect ratio of the first load transistor T1 is smaller than the aspect ratio of the first driving transistor T2. And the aspect ratio of the second load transistor T9 is smaller than the aspect ratio of the second driving transistor T10.

In the present embodiment, any of the transistors mentioned in the embodiments of the present application may be hydrogenated amorphous silicon transistors, metal oxide transistors, or low temperature polysilicon transistors.

More specifically, the above-described embodiments have described the signal amplifying circuit 100 about the various modules, or elements, or transistors, respectively. It can be understood that the embodiments can be combined to achieve a better technical effect when there is no conflict among the embodiments.

The operation of the signal amplifying circuit 100 of the present application will be described with reference to the circuit structure in FIG. 1.

When the first scanning signal line Scan1 inputs the ON signal, the reset transistor T5 is turned on. And the input signal terminal Vin writes the input signal to one terminal of the optoelectronic device 120 (the signal may be a positive voltage signal). When the optoelectronic device 120 does not sense light, the input signal of the input signal terminal Vin is applied to the top gate of the first driving transistor T2 because the optoelectronic device 120 is reverse biased.

The anode of the optoelectronic device 120 is connected to the input signal terminal Vin. The cathode of the optoelectronic device 120 is connected to the first gate of the first driving transistor T2. When the optoelectronic device 120 is not irradiated with light, the potential of the cathode of the optoelectronic device 120 is Vi. When the optoelectronic device 120 is irradiated with light, the optoelectronic device 120 generates a photocurrent that is positively related to the light intensity. In this case, the potential of the cathode is changed to (Vi−Voc), where Voc is the open circuit voltage of the optoelectronic device 120. Voc is positively related to the light intensity. Therefore, when the light is irradiated on the optoelectronic device 120, the input signal applied to the first gate of the first driving transistor T2 decreases, so that a voltage difference exists between the voltages on the gate of the first driving transistor T2 when the optoelectronic device 120 is irradiated with light and when the optoelectronic device 120 is not irradiated with light. The voltage difference is amplified by the positive feedback module 130, and is output as the voltage of the third output node P after passing through the voltage follower 140.

Specifically, the second constant voltage signal terminal Vdd continuously input signals such that the first load transistor T1 is turned on. The first output node Q is connected to the third driving transistor T3 such that the third driving transistor T3 is turned on. The second scan signal line Scan2 is connected to the gate of the third load transistor T4 such that the third load transistor T4 is turned on. The third scan signal line Scan3 is connected to the gate of the address transistor T7 such that the address transistor T7 is turned on, that is, the first load transistor T1, the fourth driving transistor, and the fourth load transistor are in an ON state when the second scan signal line Scan2, the third scan signal line Scan3, and the second constant voltage signal terminal Vdd input a signal.

Specifically, when the first scan signal line Scan1, the second scan signal line Scan2, and the third scan signal line Scan3 input a low potential, the output signal terminal Vout has no signal output.

Specifically, when the first scan signal line Scan1 inputs the ON signal and the input signal terminal Vin writes the input signal to one terminal of the optoelectronic device 120, a voltage difference exists between voltages on the gate of the first driving transistor T2 when there is no light and when there is light, so that the potential of the first output node Q changes. And then the signal of the first output node Q is output to the gate of the third driving transistor T3. When the third scan signal line Scan3 inputs the ON signal, the signal is transmitted to the output signal terminal Vout. And amplified difference in the optoelectronic signal is embodied through the signal output from the output signal terminal Vout, thereby improving the gain of the optoelectronic signal and improving the response accuracy under weak light.

Specifically, for example, when no light is irradiated on the optoelectronic device 120, the potential of the gate of the first driving transistor T2 is the input voltage Vi of the input signal terminal Vin. When light is irradiated on the optoelectronic device 120, the potential of the first gate of the first driving transistor T2 is Vg1. A voltage difference (Vi−Vg1) exists between the voltages of the gate of the first driving transistor T2 when no light is irradiated on the optoelectronic device 120 and when light is irradiated on the optoelectronic device 120 has. By the amplifying circuit of the present application, the voltage difference is amplified to m1*(Vi−Vg1), where m1 is an amplification multiple of the first inverter 131, and m1 is (W2/L2) 0.5*(W1/L1) 0.5, where W1 is the channel width of the first load transistor T1, L1 is the channel length of the first load transistor T1, W2 is the channel width of the first driving transistor T2, and L2 is the channel length of the first driving transistor T2.

It should be noted that, in order to ensure the recognition of gesture movements under weak light, the inverter needs a certain magnification. Therefore, the value of the channel length of the first driving transistor T2 is generally small, so that the switching characteristic of the first driving transistor T2 is more easily affected by the short channel, which causes the threshold voltage of the first driving transistor T2 to drift. And the drift of the threshold voltages of the different transistors is different, so that the signals amplified by the inverter with the magnification are not uniform. For example, when the threshold voltage of the first driving transistor T2 is drifted by Δ V. After amplification by the first inverter 131, the threshold voltage of the first driving transistor T2 is amplified by m1 times, that is, m1*ΔV, so that the amplified voltage difference is inaccurate.

The arrangement of the first compensation transistor T6 in the present application can compensate the threshold voltage of the first driving transistor T2. The compensation principle is as follows.

W1 is the channel width of the first load transistor T1. L1 is the channel length of the first load transistor T1. Vth1 is the threshold voltage of the first load transistor T1. The potential of the first output node Q is Vs, and the potential of the first output node Q is the same as the potential of the second gate in the first driving transistor T2. W2 is the channel width of the first driving transistor T2. L2 is the channel length of the first driving transistor T2. Vth2 is the threshold voltage of the first driving transistor T2. Vin is the potential of the first gate in the first driving transistor T2. And the following equation (1) can be obtained by equalizing the current I2 flowing through the first driving transistor T2 and the current I1 flowing through the first load transistor T1:

$$\frac{1}{2}C_{ox}\mu\frac{W1}{L1}(Vdd - Vs - Vth1)^2 = \frac{1}{2}C_{ox}\mu\frac{W2}{L2}(Vs + Vin - Vth2)^2;$$

By converting equation (1) and substituting (W2/L2) 0.5*(W1/L1) 0.5 with m1 for equation (1), the potential Vs of the first output node Q can be obtained as follows:

$$Vs = \frac{1}{m1+1}Vdd - \frac{m1}{m1+1}Vin - \frac{Vth1}{m1+1} + \frac{m1*Vth2}{m1+1};$$

According to the potential of Vs, when the threshold voltage of the first driving transistor T2 does not drift, the difference Vs1 between Vgs and Vth of the first driving transistor T2 is the following equation (2):

$$Vs1 + \frac{Vin}{1.5} - Vth2 = \frac{1}{m1+1}Vdd - \frac{m1}{m1+1} \cdot \frac{Vin}{1.5} - \frac{Vth1}{m1+1} + \frac{Vin}{1.5} - \frac{Vth2}{m1+1};$$

According to the potential Vs, when the threshold voltage of the first driving transistor T2 drifts, the difference Vs2 between Vgs and Vth of the first driving transistor T2 is the following equation (3):

$$Vs2 + \frac{Vin}{1.5} - (Vth2 + \Delta V) =$$

$$\frac{1}{m1+1}Vdd - \frac{m1}{m1+1} \cdot \frac{Vin}{1.5} - \frac{Vth1}{m1+1} + \frac{Vin}{1.5} - \frac{Vth2+\Delta V}{m1+1};$$

According to the difference between equation (2) and equation (3), the following equation (4) is obtained:

$$\left[Vs1 + \frac{Vin}{1.5} - Vth2\right] - \left[Vs2 + \frac{Vin}{1.5} - (Vth2 + \Delta V)\right] = \frac{\Delta V}{m1+1};$$

As can be seen from equation (4), for the signal amplifying circuit 100 having the first compensation transistor T6, the difference between Vgs and Vth of the first driving transistor T2 before and after the threshold voltage drift is reduced from ΔV to ΔV/(m1+1). And after amplification by the amplifier, the drift voltage is reduced from m1*ΔV to (m1*ΔV)/(m1+1), almost reduced by m1*/(m1+1) times.

As can be seen from the above, the arrangement of the first compensation transistor T6 of the present application can compensate for the threshold voltage of the first driving transistor T2 so as to reduce the drifted portion in the threshold voltage of the first driving transistor T2 by 1/(m1+1) times, which erase the difference of the threshold voltages in different transistors, and solve the technical problem of bad uniformity in signals amplified by the inverter.

It should be noted that the above Vin is changed to Vin/1.5 because the modulation capability ratio of the bottom gate to the top gate is 1:1.5, the ratio varies depending on the modulation capability of the top gate to the bottom gate. The compensation principle of the present application is described by using only 1:1.5 as an example.

Referring to FIG. 2, the circuit structure of FIG. 2 is the same as or similar to that of FIG. 1, except that the positive feedback module 130 further includes a second amplifier.

In the present embodiment, the second inverter 132 includes a second load transistor T9, a second driving transistor T10, a second compensation transistor T8, a second storage capacitor C2, and a second output node M. The gate of the second load transistor T9 is connected to the second constant voltage signal terminal Vdd. The first electrode of the second load transistor T9 is connected to the second constant voltage signal terminal Vdd. The second electrode of the second load transistor T9 and the first electrode of the second driving transistor T10 are connected to the second output node M. The gate of the first load transistor T1 is connected to the second output node M. The second electrode of the second driving transistor T10 is connected to the first constant voltage signal terminal Vgnd.

In the present embodiment, the second driving transistor T10 includes a first gate and a second gate. The first gate of the second driving transistor T10 is connected to the first output node Q. The first electrode of the second compensation transistor T8 is connected to the second output node M. The second electrode of the second compensation transistor T8 is connected to the second gate of the second driving transistor T10.

In the present embodiment, the second compensation transistor T8 may have a single gate or double gates. When the second compensation transistor T8 has a single gate, the gate of the second compensation transistor T8 is connected to the first scan signal line Scan1. When the second compensation transistor T8 has double gates, referring to FIG. 2, the first gate of the second compensation transistor T8 is connected to the first scan signal line Scan1, and the second gate of the first compensation transistor T6 may be connected to the fourth scan signal line Scan4. In the present application, by connecting the first gate of the second compensation transistor T8 to the preceding scan signal line, an increased on-state current and a decreased off-state current can be obtained. And when the preceding scan signal line is turned on, the potential of the first output node Q can be output to and precharge the second gate of the second driving transistor T10. Further, the present application adjusts the threshold voltage of the second compensation transistor T8 by adjusting the value of the input voltage of the fourth scan signal line Scan4.

In the present embodiment, the gate(s) of the second load transistor T9 may be a single gate or double gates. For example, the second load transistor T9 may include a first gate and a second gate, the first gate of the second load transistor T9 is connected to the first electrode of the second load transistor T9, and the second gate of the second load transistor T9 is connected to the second output node M. In the present application, by making the second load transistor T9 with double-gate design, the control capability of the second load transistor T9 can be improved, and the stability of the circuit can be improved.

Referring to FIG. 2, the first plate of the second storage capacitor C2 is connected to the second gate of the second driving transistor T10, and the second plate of the second storage capacitor C2 is connected to the first constant voltage signal terminal Vgnd.

In the present embodiment, when the second compensation transistor T8 is turned on, the second compensation transistor T8 allows the potential of the second output node M to precharge the second gate of the second driving transistor T10, while the potential of the second output node M is maintained by the second storage capacitor C2, and the second storage capacitor C2 can maintain the potential of the second gate of the first driving transistor T2 at the same potential as the second output node M. The setting of the second storage capacitor C2 allows continuous adjustment of the threshold voltage of the second driving transistor T10 to avoid that the potential of the second gate of the second driving transistor T10 cannot be maintained at the same potential as the second output node M due to leakage current.

The operation of the signal amplifying circuit 100 will be described with reference to the circuit structure shown in FIG. 2.

When the first scanning signal line Scan1 inputs the ON signal, the reset transistor T5 is turned on. And the input signal terminal Vin writes the input signal to the second terminal of the optoelectronic device 120 (the signal may be a positive voltage signal). When the optoelectronic device 120 does not sense light, the input signal of the input signal terminal Vin is applied to the first gate of the first driving transistor T2 because the optoelectronic device 120 is reverse biased. When the light is irradiated on the optoelectronic device 120, the input signal applied to the first gate of the first driving transistor T2 decreases, so that a voltage difference exists between voltages on the gate of the first driving transistor T2 when the light is irradiated on the optoelectronic device 120 and when the light is not irradiated on the optoelectronic device 120. The voltage difference is amplified by the positive feedback module 130, and is output as a voltage of the third output node P through the voltage follower 140.

Specifically, the second constant voltage signal terminal Vdd continuously inputs signals such that the second load transistor T9 is in an ON state. The second output node M is connected to the first gate of the first load transistor T1 such that the first load transistor T1 is turned on. The first output node Q is connected to the first gate of the second driving transistor T10. The first output node Q is connected to the third driving transistor T3 such that the second driving transistor T10 is turned on. The fourth driving transistor is turned on, and the second scan signal line Scan2 is connected to the gate of the third load transistor T4 such that the third load transistor T4 is turned on. That is, the first load transistor T1, the second load transistor T9, the second driving transistor T10, the fourth driving transistor, and the fourth load transistor are in an ON state when the second scan signal line Scan2 and the second constant voltage signal terminal Vdd input a signal.

Specifically, when the first scan signal line Scan1, the second scan signal line Scan2, and the third scan signal line Scan3 input a low potential, the output signal terminal Vout has no signal output.

Specifically, when the first scan signal line Scan1 inputs the ON signal and the input signal terminal Vin writes the input signal to one terminal of the optoelectronic device 120, there is a voltage difference between voltages at the gate of the first driving transistor T2 in the absence of light and in the presence of light, so that the potential of the first output node Q changes. The changed potential of the first output node Q causes the potential of the second driving transistor T10 to change, thereby causing the potential of the second output node M to change. The changed potential of the second output node M causes the potential of the gate of the first load transistor T1 to change, thereby causing the potential of the first output node Q to change. And the continuation of the process will cause the potential of the first output node Q and the second output node M to oscillate, so that the output signal of an inverter at each stage approaches or even reaches the range of the optimal input signal of the inverter at a next stage, and then the signal is output to the gate of the third driving transistor T3, so that the multi-stage inverters determines the optimal magnification on the basis of the potential change of the output node. When the third scan signal line Scan3 inputs the ON signal, the signal is transmitted to the output signal terminal Vout, and the signal output from the output signal terminal Vout embodies the amplified difference in the photoelectric signal, thereby improving the gain of the photoelectric signal and the response accuracy in weak light.

Specifically, for example, when no light is irradiated on the optoelectronic device 120, the potential of the gate of the first driving transistor T2 is the input voltage Vi of the input signal terminal Vin. When light is irradiated on the optoelectronic device 120, the potential of the gate of the first driving transistor T2 is Vg1. A voltage difference (Vi−Vg1) exists between the voltages on the gate of the first driving transistor T2 when no light is irradiated on the optoelectronic device 120 and when light is irradiated on the optoelectronic device 120. By the amplifying circuit of the present application, the voltage difference is amplified to m1*m2*(Vi−Vg1), where m1 and m2 are amplification multipliers. Specifically, take two-stage inverters as an example, where the amplification multiplier of the first inverter 131 is m1 and the amplification multiplier of the second inverter 132 is m2, the amplification multiplier obtained by the amplifying circuit of the present application may be approximately m1*m2.

In the present embodiment, m1 is (W2/L2) 0.5*(W1/L1) 0.5, where W1 is the channel width of the first load transistor T1, L1 is the channel length of the first load transistor T1, W2 is the channel width of the first driving transistor T2, and L2 is the channel length of the first driving transistor T2; m2 is (W4/L4) 0.5*(W3/L3) 0.5, where W4 is the channel width of the second load transistor T9, L4 is the channel length of the second load transistor T9, W3 is the channel width of the second driving transistor T10, and L3 is the channel length of the second driving transistor T10.

Further, when the threshold voltage of the first driving transistor T2 is drifted by ΔV1, the setting of the first compensation transistor T6 in the present application can reduce the drifted threshold voltage to ΔV1/(m1+1). When the threshold voltage of the second driving transistor T10 is drifted by ΔV2, the setting of the second compensation transistor T8 in the present application can reduce the drifted threshold voltage to ΔV2/(m2+1). Therefore, for the multi-stage inverters, the compensation transistor in each stage can compensate for the threshold voltage in the driving transistor, thereby erasing the difference of the threshold voltages in different transistors, and solving the technical problem of bad uniformity in signals amplified by the inverter.

Similarly, for inverters of three or more stages, reference may be made to the above-described embodiments.

Figure 3:
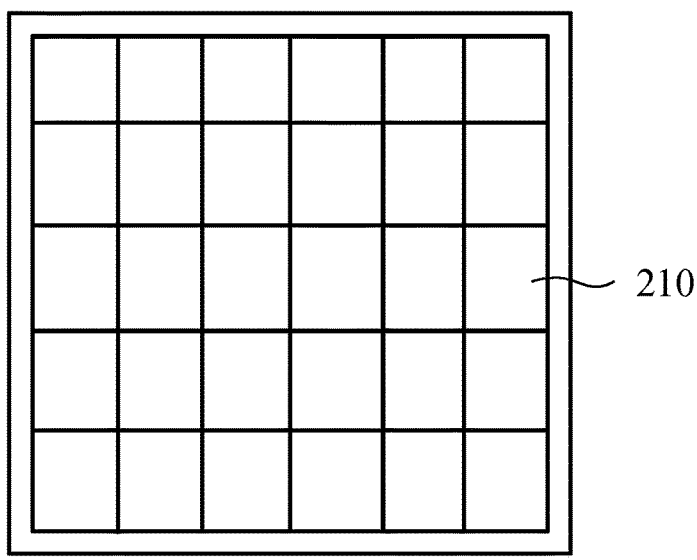
FIG. 3 is a schematic structure diagram of a display device according to an embodiment of the present application.
Figure 4:
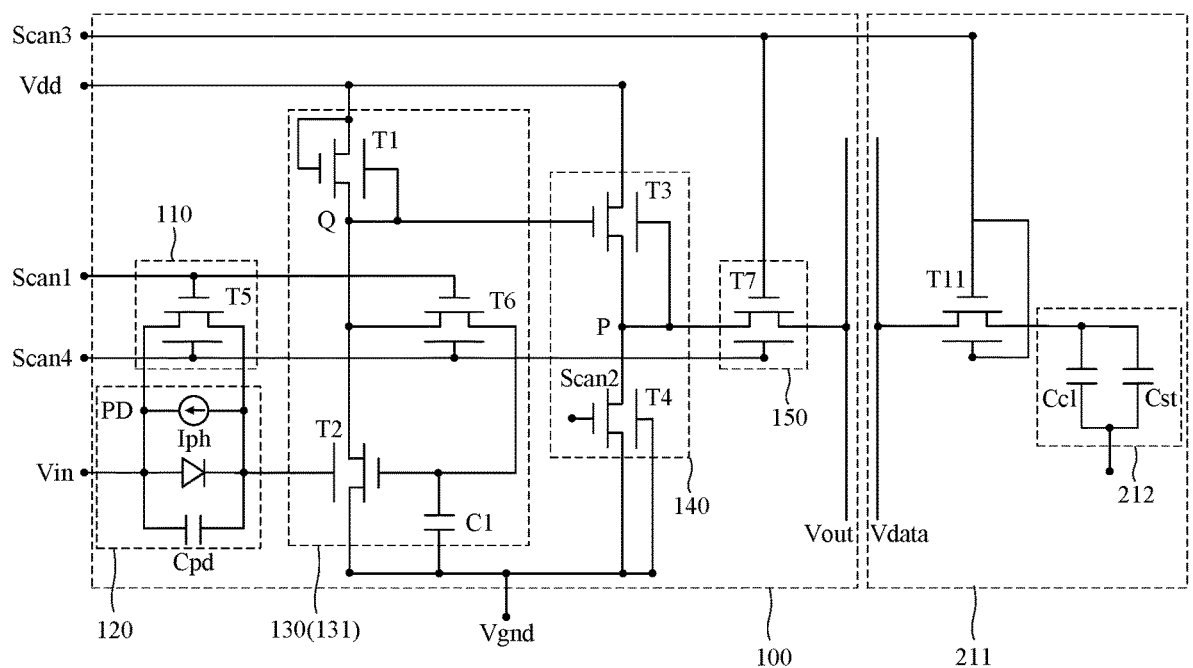
FIG. 4 is a circuit diagram of a signal amplifying circuit and a pixel circuit within a pixel unit of FIG. 3.

Referring to FIGS. 3 and 4, an embodiment of the present application provides a display apparatus 200 further comprising a plurality of pixel units 210, at least one of which includes a signal amplifying circuit 100 according to any one of the above embodiments and a pixel circuit 211.

Referring to FIG. 4, the pixel circuit 211 includes scan lines, a data line Vdata, a control transistor T11, and a light emitting unit 212. The gate of the control transistor T11 is connected to a scan line. The first electrode of the control transistor T11 is connected to the data line Vdata, and the second electrode of the control transistor T11 is electrically connected to the light emitting unit 212. By arranging the pixel circuit 211 and the signal amplifying circuit 100 in one same pixel, the recognition accuracy of the photoelectric signal can be improved.

In the present embodiment, the control transistor T11 may have a single gate. The gate(s) of the control transistor T11 may also include a first gate and a second gate. The first gate and the second gate of the control transistor T11 are respectively one of a bottom gate and a top gate that are different from each other. Referring to FIG. 3, the first gate and the second gate of the control transistor T11 are both connected to the third scan signal line Scan3, and an increased on-state current and a decreased off-state current can be obtained. And when a current scan signal line is turned on by a progressive scan square wave signal, the data voltage input from the data line Vdata can be output to the light emitting unit 212.

Referring to FIG. 4, the scan lines include a second scan signal line Scan2. By connecting the second scan signal line Scan2 to the gate of the addressing transistor T7 in the signal amplifying circuit 100 and the control transistor T11 in the pixel circuit 211 at the same time, the number of scan lines can be reduced without causing the signal amplifying circuit 100 to interfere with the pixel circuit 211.

Referring to FIG. 4, the light emitting unit 212 includes a liquid crystal light emitting unit and an organic light emitting diode light emitting unit.

Referring to FIG. 4, the light emitting unit 212 includes a liquid crystal capacitor Clc and a storage capacitor Cst.

In the above-mentioned embodiments, the description of each embodiment has its own emphasis, and parts not described in detail in a certain embodiment may be referred to the related description of other embodiments.

The present invention has been described in detail with reference to a signal amplifying circuit and a display device according to an embodiment of the present invention. A specific example is used herein to illustrate the principles and embodiments of the present invention. The description of the above embodiments is merely provided to help understand the technical solution and the core idea of the present application. It will be appreciated by those of ordinary skill in the art that modifications may still be made to the technical solutions described in the foregoing embodiments, or equivalents may be made to some of the technical features therein. These modifications or equivalents do not depart the essence of the corresponding technical solutions from the scope of the technical solutions of the embodiments of the present application.

What is claimed is:

1. A signal amplifying circuit, comprising:
a reset module, wherein an input terminal of the reset module is connected to an input signal terminal;
an optoelectronic device, wherein a first terminal of the optoelectronic device is connected to an output terminal of the reset module, and a second terminal of the optoelectronic device is connected to the input signal terminal and the input terminal of the reset module;
a positive feedback module, wherein a first terminal of the positive feedback module is connected to a first constant voltage signal terminal, a second terminal of the positive feedback module is connected to a second constant voltage signal terminal, the positive feedback module at least comprises a first inverter, the first inverter comprises a first load transistor, a first driving transistor and a first output node, the first load transistor and the first driving transistor are connected to the first output node in the first inverter, the first output node is electrically connected to the output signal terminal, and a potential of the second constant voltage signal terminal is larger than a potential of the first constant voltage signal terminal;
wherein the first inverter further comprises a first compensation transistor, the first driving transistor comprises a first gate and a second gate, the first gate of the first driving transistor being connected to the output terminal of the reset module, a first electrode of the first compensation transistor being connected to the first output node, and a second electrode of the first compensation transistor being connected to the second gate of the first driving transistor.

2. The signal amplifying circuit of claim 1, wherein the first inverter further comprises a first storage capacitor, a first plate of the first storage capacitor being connected to the second gate of the first driving transistor, and a second plate of the first storage capacitor being connected to the first constant voltage signal terminal.

3. The signal amplifying circuit of claim 1, wherein the first load transistor comprises a first gate and a second gate, the first gate of the first load transistor being connected to a first electrode of the first load transistor, and the second gate of the first load transistor being connected to the first output node.

4. The signal amplifying circuit of claim 1, wherein the positive feedback module further comprises a second inverter comprising a second load transistor, a second driving transistor, a second compensation transistor, and a second output node, a gate of the second load transistor is connected to the second constant voltage signal terminal, a first electrode of the second load transistor is connected to the second constant voltage signal terminal, a second electrode of the second load transistor and a first electrode of the second driving transistor are connected to the second output node, a gate of the first load transistor is connected to the second output node, and a second electrode of the second driving transistor is connected to the first constant voltage signal terminal;
wherein the second driving transistor comprises a first gate and a second gate, the first gate of the second driving transistor being connected to the first output node, a first electrode of the second compensation transistor being connected to the second output node, and a second electrode of the second compensation transistor being connected to the second gate of the second driving transistor.

5. The signal amplifying circuit of claim 1, wherein the reset module comprises a reset transistor, a first electrode of the reset transistor being connected to the input signal terminal, a second electrode of the reset transistor being connected to the first terminal of the optoelectronic device, and a gate of the reset transistor being connected to a first scan signal line.

6. The signal amplifying circuit of claim 2, wherein the reset module comprises a reset transistor, a first electrode of the reset transistor being connected to the input signal terminal, a second electrode of the reset transistor being connected to the first terminal of the optoelectronic device, and a gate of the reset transistor being connected to a first scan signal line.

7. The signal amplifying circuit of claim 3, wherein the reset module comprises a reset transistor, a first electrode of the reset transistor being connected to the input signal terminal, a second electrode of the reset transistor being connected to the first terminal of the optoelectronic device, and a gate of the reset transistor being connected to a first scan signal line.

8. The signal amplifying circuit of claim 4, wherein the reset module comprises a reset transistor, a first electrode of the reset transistor being connected to the input signal terminal, a second electrode of the reset transistor being connected to the first terminal of the optoelectronic device, and a gate of the reset transistor being connected to a first scan signal line.

9. The signal amplifying circuit of claim 5, further comprising a voltage follower comprising a third load transistor, a third driving transistor, and a third output node, a gate of the third driving transistor being connected to the first output node, a first electrode of the third driving transistor being connected to the second constant voltage signal terminal, a second electrode of the third driving transistor and a first electrode of the third load transistor being connected to the third output node, a gate of the third load transistor being connected to a second scan signal line, and a second electrode of the third load transistor being connected to the first constant voltage signal terminal.

10. The signal amplifying circuit of claim 9, wherein the third driving transistor comprises a first gate and a second gate, the first gate of the third driving transistor is connected to the first output node, and the second gate of the third driving transistor is connected to the third output node; and
the third load transistor comprises a first gate connected to the second scan signal line and a second gate connected to the first constant voltage signal terminal.

11. The signal amplifying circuit of claim 9, further comprising an addressing module comprising an addressing transistor, a first electrode of the addressing transistor being connected to the third output node, a gate of the addressing transistor being connected to a third scan signal line, and a second electrode of the addressing transistor being connected to the output signal terminal.

12. The signal amplifying circuit of claim 11, wherein the reset transistor comprises a first gate and a second gate, the first gate of the reset transistor is connected to the first scan signal line, and the second gate of the reset transistor is connected to a fourth scan signal line;
the first compensation transistor comprises a first gate and a second gate, the first gate of the first compensation transistor is connected to the first scan signal line, and the second gate of the first compensation transistor is connected to the fourth scan signal line; and
the addressing transistor comprises a first gate connected to the third scan signal line and a second gate connected to the fourth scan signal line.

13. A display device comprising a plurality of pixel units, at least one of the pixel units comprising a signal amplifying circuit and a pixel circuit, the signal amplifying circuit comprising:
a reset module, wherein an input terminal of the reset module is connected to an input signal terminal;
an optoelectronic device, wherein a first terminal of the optoelectronic device is connected to an output terminal of the reset module, and a second terminal of the optoelectronic device is connected to the input signal terminal and the input terminal of the reset module;
a positive feedback module, wherein a first terminal of the positive feedback module is connected to a first constant voltage signal terminal, a second terminal of the positive feedback module is connected to a second constant voltage signal terminal, the positive feedback module at least comprises a first inverter, the first inverter comprises a first load transistor, a first driving transistor and a first output node, the first load transistor and the first driving transistor are connected to the first output node in the first inverter, the first output node is electrically connected to the output signal terminal, and a potential of the second constant voltage signal terminal is larger than a potential of the first constant voltage signal terminal;
wherein the first inverter further comprises a first compensation transistor, the first driving transistor comprises a first gate and a second gate, the first gate of the first driving transistor being connected to the output terminal of the reset module, a first electrode of the first compensation transistor being connected to the first output node, and a second electrode of the first compensation transistor being connected to the second gate of the first driving transistor.

14. The display device of claim 13, wherein the first inverter further comprises a first storage capacitor, a first plate of the first storage capacitor being connected to the second gate of the first driving transistor, and a second plate of the first storage capacitor being connected to the first constant voltage signal terminal.

15. The display device of claim 13, wherein the first load transistor comprises a first gate and a second gate, the first gate of the first load transistor being connected to a first electrode of the first load transistor, and the second gate of the first load transistor being connected to the first output node.

16. The display device of claim 13, wherein the positive feedback module further comprises a second inverter comprising a second load transistor, a second driving transistor, a second compensation transistor, and a second output node, a gate of the second load transistor is connected to the second constant voltage signal terminal, a first electrode of the second load transistor is connected to the second constant voltage signal terminal, a second electrode of the second load transistor and a first electrode of the second driving transistor are connected to the second output node, a gate of the first load transistor is connected to the second output node, and a second electrode of the second driving transistor is connected to the first constant voltage signal terminal;
wherein the second driving transistor comprises a first gate and a second gate, the first gate of the second driving transistor being connected to the first output node, a first electrode of the second compensation transistor being connected to the second output node, and a second electrode of the second compensation transistor being connected to the second gate of the second driving transistor.

17. The display device of claim 13, wherein the reset module comprises a reset transistor, a first electrode of the reset transistor being connected to the input signal terminal, a second electrode of the reset transistor being connected to the first terminal of the optoelectronic device, and a gate of the reset transistor being connected to a first scan signal line.

18. The display device of claim 17, further comprising a voltage follower comprising a third load transistor, a third driving transistor, and a third output node, a gate of the third driving transistor being connected to the first output node, a first electrode of the third driving transistor being connected to the second constant voltage signal terminal, a second electrode of the third driving transistor and a first electrode of the third load transistor being connected to the third output node, a gate of the third load transistor being connected to a second scan signal line, and a second electrode of the third load transistor being connected to the first constant voltage signal terminal.

19. The display device of claim 18, wherein the third driving transistor comprises a first gate and a second gate, the first gate of the third driving transistor is connected to the first output node, and the second gate of the third driving transistor is connected to the third output node; and
the third load transistor comprises a first gate connected to the second scan signal line and a second gate connected to the first constant voltage signal terminal.

20. The display device of claim 18, further comprising an addressing module comprising an addressing transistor, a first electrode of the addressing transistor being connected to the third output node, a gate of the addressing transistor being connected to a third scan signal line, and a second electrode of the addressing transistor being connected to the output signal terminal.

* * * * *